United States Patent
Wang et al.

(10) Patent No.: US 10,192,915 B1
(45) Date of Patent: Jan. 29, 2019

(54) OPTICAL SENSOR AND MANUFACTURING METHOD THEREOF

(71) Applicant: VisEra Technologies Company Limited, Hsin-Chu (TW)

(72) Inventors: Wei-Ko Wang, Taoyuan (TW); Yueh-Ching Cheng, Hsinchu (TW); Chia-Hui Wu, Lunbei Township, Yunlin County (TW)

(73) Assignee: Visera Technologies Company Limited, Hsin-Chu (TW)

( * ) Notice: Subject to any disclaimer, the term of this patent is extended or adjusted under 35 U.S.C. 154(b) by 0 days.

(21) Appl. No.: 15/652,759

(22) Filed: Jul. 18, 2017

(51) Int. Cl.
*H01L 27/00* (2006.01)
*H01L 27/146* (2006.01)
*H01L 23/544* (2006.01)
*H01L 21/68* (2006.01)
*G02B 5/00* (2006.01)

(52) U.S. Cl.
CPC ........ *H01L 27/14623* (2013.01); *H01L 21/68* (2013.01); *H01L 23/544* (2013.01); *H01L 27/14621* (2013.01); *H01L 27/14636* (2013.01); *H01L 27/14645* (2013.01); *H01L 27/14685* (2013.01); *G02B 5/003* (2013.01); *H01L 27/1464* (2013.01); *H01L 2223/54426* (2013.01)

(58) Field of Classification Search
CPC .................................................. H01L 27/14623
See application file for complete search history.

(56) References Cited

U.S. PATENT DOCUMENTS

2006/0202295 A1    9/2006   Wu et al.
2017/0166762 A1*   6/2017   Tomeba .................. C09D 5/32

FOREIGN PATENT DOCUMENTS

JP    2008053713 A    3/2008
JP    2010062417 A    3/2010
JP    2011159706 A    8/2011

* cited by examiner

*Primary Examiner* — William Harriston
(74) *Attorney, Agent, or Firm* — Muncy, Geissler, Olds & Lowe, P.C.

(57) ABSTRACT

An optical sensor includes a sensing layer, a first shading filter, a second shading filter, and an alignment mark. The sensing layer includes an active area, a shading area, and a peripheral area. The sensing layer includes sensing units located in the active area. The first shading filter is disposed on the shading area. The second shading filter is disposed on the first shading filter. The alignment mark is disposed on the peripheral area. When a light beam is emitted to the shading area, the second shading filter is configured to block a first component of the light beam, and the first shading filter is configured to block a second component of the light beam.

20 Claims, 8 Drawing Sheets

OPTICAL SENSOR AND MANUFACTURING METHOD THEREOF

BACKGROUND OF THE INVENTION

Field of the Invention

The present disclosure relates to an optical sensor, and in particular to an optical sensor with shading filters.

Description of the Related Art

An optical sensor, such as a spectrum sensor or an image sensor, is configured to detect light or capture an image from an object. In general, the optical sensor utilizes photodiodes in a sensing layer to sense light, and covert the light into electrical signals.

The optical sensor is generally mounted in an electrical device, such as a spectrum meter or a camera. When a light beam is emitted into the electrical device, the light beam may be reflected by the housing or a metal element in the electrical device to some photodiodes. The reflected light beams falling on the photodiodes are represented as noises, which causes the quality of the detection or the image to decrease, and thus shall be reduced. In the conventional art, a block material disposed on the sensing layer is utilized to block the reflected light beam to fall on the photodiodes.

However, when the block material is formed on the sensing layer, the alignment marks on the sensing layer are covered by the block material. This causes an alignment device to not detect the alignment marks, and thus the subsequence processes cannot be performed. The conventional practice is to manually remove the block material over the alignment marks. However, this causes the manufacturing time of the optical sensor to be greatly increased. Consequently, it is desirable to provide a solution for improving the manufacturing time of the optical sensor.

BRIEF SUMMARY OF THE INVENTION

The present disclosure provides an optical sensor and the manufacturing method thereof for decreasing the manufacturing time of the optical sensor.

The present disclosure provides an optical sensor including a sensing layer, a first shading filter, and a second shading filter. The sensing layer includes an active area, a shading area around the active area, and a peripheral area around the shading area. The first shading filter is disposed on the shading area. The second shading filter is disposed on the first shading filter. When a light beam is emitted to the shading area, the second shading filter is configured to block a first component of the light beam, and the first shading filter is configured to block a second component of the light beam.

In some embodiments, the first shading filter is distant from the peripheral area. The second shading filter is further disposed on the peripheral area. The optical sensor further includes a conductive pad disposed on the peripheral area, and an alignment mark disposed on the peripheral area and distant from the conductive pad.

In some embodiments, the first shading filter and the second shading filter are distant from the active area in a stacking direction perpendicular to the sensing layer.

In some embodiments, the optical sensor further includes color filters disposed on the active area. The first shading filter is around the color filters. The first shading filter is further disposed on the color filters, and the second shading filter is distant from the color filters. In some embodiments, the second shading filter is further disposed on the color filters, and the first shading filter is distant from the color filters.

In some embodiments, the first component of the light beam blocked by the second shading filter comprises an infrared component, and the second component of the light beam blocked by the first shading filter comprises a visible component and an ultraviolet component.

In some embodiments, the first component of the light beam blocked by the second shading filter comprises a visible component and an ultraviolet component, and the second component of the light beam blocked by the first shading filter comprises a visible component and an infrared component.

In some embodiments, the first shading filter is a short-pass filter, and the second shading filter is a long-pass filter. In some embodiments, the first shading filter is a long-pass filter, and the second shading filter is a short-pass filter.

In some embodiments, the first shading filter is configured to block wavelengths of the light beam longer than a first wavelength, the second shading filter is configured to block wavelengths of the light beam shorter than a second wavelength, and the first wavelength is shorter than the second wavelength.

In some embodiments, the first shading filter is configured to block wavelengths of the light beam shorter than a second wavelength, the second shading filter is configured to block wavelengths of the light beam longer than a first wavelength, and the first wavelength is shorter than the second wavelength.

In some embodiments, the first shading filter is made of a photoresist or multilayer coating, and the second shading filter is made of a photoresist.

The present disclosure provides a manufacturing method of an optical sensor including forming a first shading filter on an active area, a shading area and a peripheral area of a sensing layer, wherein the shading area is around the active area, and the peripheral area is around the shading area, and an alignment mark is located on the peripheral area; and performing an alignment process on the alignment mark by an alignment device. The manufacturing method further includes removing the first shading filter over the peripheral area; and forming a second shading filter on the shading area. The light beam is emitted to the shading area, the second shading filter is configured to block a first component of the light beam, and the first shading filter is configured to block a second component of the light beam.

In some embodiments, the manufacturing method of the optical sensor further includes forming color filters on the sensing layer. The first shading filter is around the color filters.

In some embodiments, the manufacturing method of the optical sensor further includes performing a second alignment process on the alignment mark by a second alignment device, and removing the second shading filter over the peripheral area.

In conclusion, the optical sensor utilizes the first shading filter and the second shading filter to replace the block material in the conventional art. Therefore, the first shading filter above the alignment mark does not need to be manually removed during the manufacturing process of the optical sensor, and thus the manufacturing time of the optical sensor is decreased.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
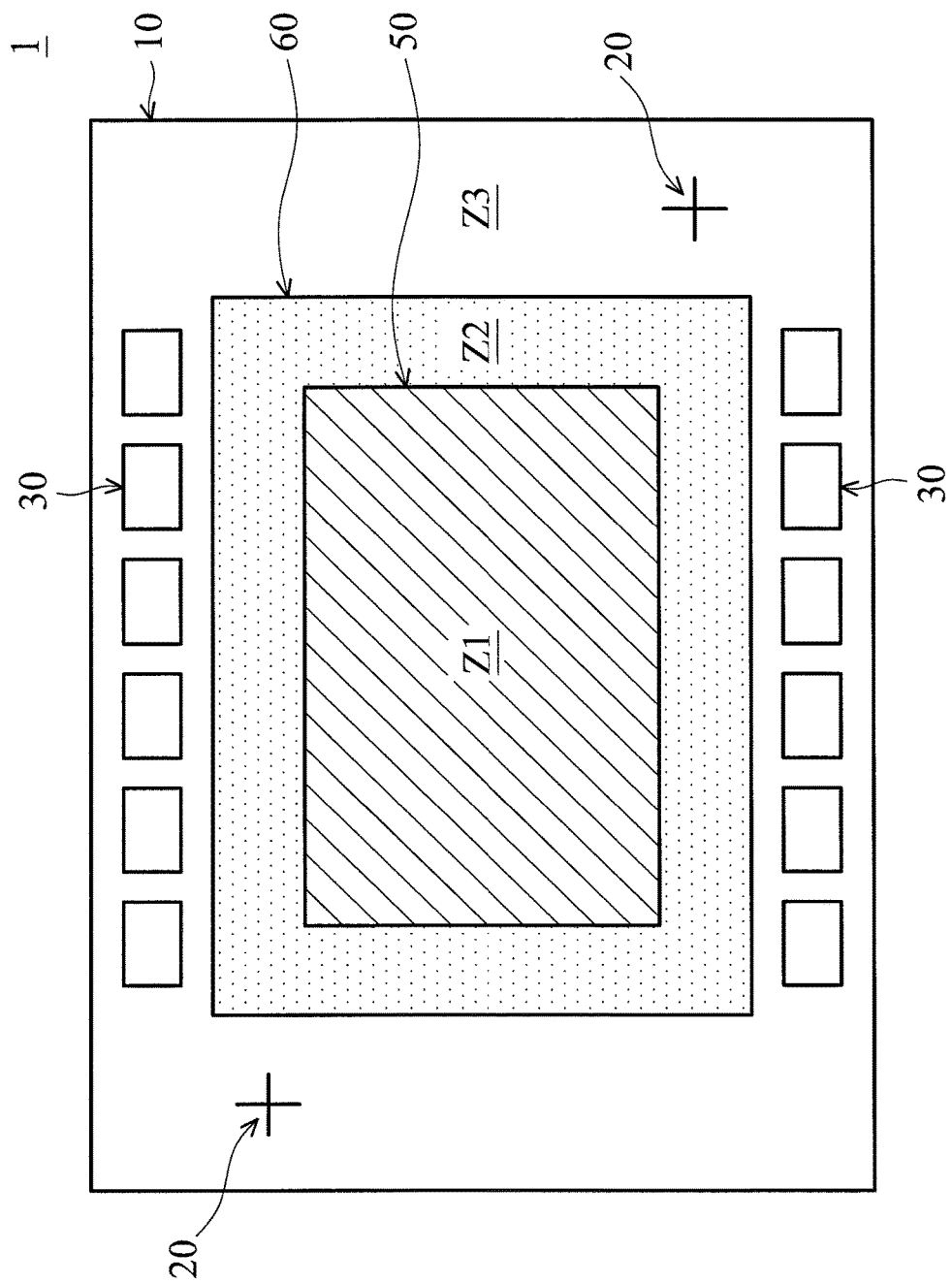
FIG. 1 is a top view of an optical sensor in accordance with some embodiments of the present disclosure.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Furthermore, the shape, size, and thickness in the drawings may not be drawn to scale, or the drawings may be otherwise simplified for clarity of discussion, as they are intended merely for illustration.

It should be understood that additional operations can be provided before, during, and after the method, and some of the operations described can be replaced or eliminated for other embodiments of the method.

Figure 2:
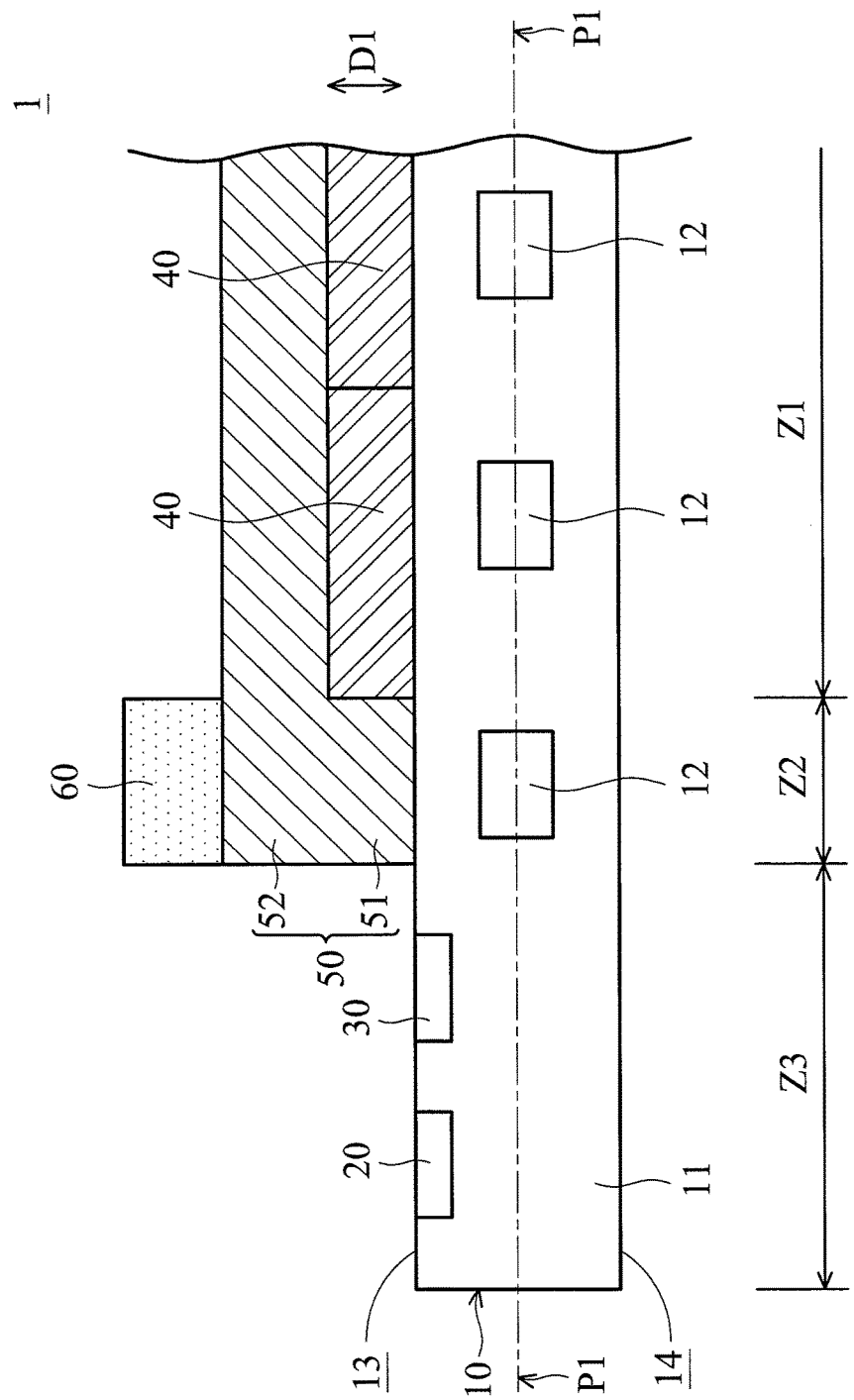
FIG. 2 is a cross-sectional view of the optical sensor in accordance with some embodiments of the present disclosure.

FIG. 1 is a top view of an optical sensor 1 in accordance with some embodiments of the present disclosure. FIG. 2 is a cross-sectional view of the optical sensor 1 in accordance with some embodiments of the present disclosure. The optical sensor 1 is configured to sense light beams, and covert the light beams into electrical signals.

In some embodiments, the optical sensor 1 is a CMOS (Complementary Metal-Oxide-Semiconductor) sensor. In some embodiments, the optical sensor 1 is a BSI (backside illumination) CMOS sensor. In some embodiments, the optical sensor 1 is an image sensor configured to capture an image. The image sensor can be applied to an imaging apparatus, such as a digital camera.

In some embodiments, the optical sensor 1 is a spectrum sensor configured to detect the spectrum of an object. The spectrum sensor can be applied to a spectrum meter.

The optical sensor 1 includes a sensing layer 10, alignment marks 20, conductive pads 30, color filters 40, a first shading filter 50, and a second shading filter 60. The sensing layer 10 extends along a reference plane P1. The sensing layer 10 is configured to detect incident light beams according to the light beams falling on the sensing layer 10.

The sensing layer 10 is defined as an active area Z1, a shading area Z2, and a peripheral area Z3. The active area Z1, the shading area Z2, and the peripheral area Z3 are located at the reference plane P1. In some embodiments, the active area Z1 is located at the center of the sensing layer 10, and located between the top surface 13 and the bottom surface 14.

The shading area Z2 is a ring-like shape, and is around the active area Z1. The shading area Z2 is located between the active area Z1 and the peripheral area Z3, and between the top surface 13 and the bottom surface 14. The peripheral area Z3 is a ring-like shape, and is around the shading area Z2. The peripheral area Z3 is located at the edges of the sensing layer 10, and located between the top surface 13 and the bottom surface 14.

The sensing layer 10 may include all of the following elements, but the sensing layer 10 does not necessarily include all of the following elements, as long as the object of the sensing layer 10 is achieved. The sensing layer 10 includes a substrate 11 and sensing units 12. In some embodiments, the sensing layer 10 further includes other components or layers (not shown in figures), such as electrical circuits underneath of the sensing units 12 and a passivation layer configured to protect the electrical circuits.

The sensing units 12 are disposed in the substrate 11, and arranged in an array at the reference plane P1. In this embodiment, the sensing units 12 are located in the active area Z1 and the shading area Z2, but are not located in the peripheral area Z3. In some embodiment, the sensing units 12 are located in the active area Z1, but are not located in the shading area Z2 and the peripheral area Z3.

In some embodiments, the sensing units 12 are photodiodes. Each of the sensing units 12 is configured to sense light beams and generate electrical signals according to the intensity of the light beams falling thereon. In some embodiments, an image can be generated according to the electrical signals by a process chip (not shown in figures).

The alignment mark 20 is used for an alignment process. The alignment marks 20 is a cross shape, but the shapes of the alignment marks 20 are various. The alignment marks 20 are disposed on the substrate 11 and the peripheral area Z3. The alignment marks 20 are exposed from the top surface 13, and may not protrude over the top surface 13. In some embodiments, the alignment marks 20 are not disposed on the active area Z1 and the shading area Z2.

The conductive pads 30 are disposed on the substrate 11 and the peripheral area Z3. The conductive pads 30 are disposed on and connected to the top surface 13. In some embodiments, the conductive pads 30 are exposed from the top surface 13, and may not protrude over the top surface 13. In some embodiments, the conductive pads 30 are not disposed on the active area Z1 and the shading area Z2.

The conductive pads 30 are electrically connected to the sensing units 12. In some embodiments, the conductive pads 30 are configured to be connected to wires (not shown in figures). The conductive pads 30 are connected to the process chip with the wires. In other words, the sensing units 12 are electrically connected to the process chip via the conductive pads 30.

The color filters 40 are disposed on the active area Z1 of the sensing layer 10. Each of the color filters 40 is aligned to one of the sensing units 12 in a stacking direction D1. The stacking direction D1 is perpendicular to the sensing layer 10 and the reference plane P1. The color filters 40 are arranged in an array on a plane parallel to the reference plane P1.

Each of the color filters 40 allows a predetermined range of wavelengths of a light beam to pass through. In some embodiments, color filters 40 include red color filters, green color filters, and blue color filters. For example, the red color filters allow wavelengths of a light beam in a range from 620 nm to 750 nm (red light) to pass to the sensing units 12. The green color filters allow wavelengths of a light beam in a range from 495 nm to 570 nm (green light) to pass to the sensing units 12. The blue color filters allow wavelengths of a light beam in a range from 476 nm to 495 nm (blue light) to pass to the sensing units 12.

The first shading filter 50 is disposed on the sensing layer 10 and the color filter 40. In some embodiments, the first shading filter 50 is not disposed on the peripheral area Z3.

As shown in FIGS. 1 and 2, the first shading filter 50 includes a lower portion 51 and an upper portion 52. The lower portion 51 is disposed on the shading area Z2. The lower portion 51 is connected to the sensing layer 10 and the side walls of the color filters 40. The lower portion 51 is around the color filters 40. In the other words, the lower portion 51 is a ring-like shape. In some embodiments, the height of the lower portion 51 relative to the sensing layer 10 is equal to the height of the color filters 40 relative to the sensing layer 10.

The upper portion 52 is disposed on the lower portion 51 and the color filters 40. In other words, the upper portion 52 is located over the active area Z1 and the shading area Z2. In some embodiments, the upper portion 52 is not disposed on the color filters 40, and is not located over the active area Z1.

In some embodiments, the first shading filter 50 is a short-pass filter. In some embodiments, the first shading filter 50 is made of a photoresist or multilayer coating. The first shading filter 50 is configured to block components (remained components) of the light beam emitted to the shading area Z2. The components of the light beam blocked by the first shading filter 50 include an infrared spectrum.

The first shading filter 50 is configured to block wavelengths of a light beam longer than a specific wavelength (first wavelength). In some embodiments, the first wavelength is in a range from about 740 nm to 768 nm. In some embodiments, the first wavelength is about 760 nm. In this embodiment, the wavelengths of a light beam blocked by the first shading filter 50 is defined as the transmittance of the wavelengths of the light beam passing through the first shading filter 50 being lower than 20%.

Therefore, an infrared spectrum of a light beam is blocked by the first shading filter 50. The sensing units 12 under the color filter 40 may not receive the infrared spectrum, and thus the quality of the image made by the optical sensor 1 is improved.

The second shading filter 60 is disposed on the first shading filter 50, and located over the shading area Z2. The second shading filter 60 is not disposed on the peripheral area Z3 and the active area Z1. In other words, the second shading filter 60 is a ring-like shape. In some embodiments, the second shading filter 60 is further disposed on the peripheral area Z3.

In some embodiments, the second shading filter 60 is not disposed on the first shading filter 50 (or the color filters 40) above the active area Z1. The first shading filter 50 and the second shading filter 60 are not disposed on the active area Z1 in the stacking direction D1 at the same time.

In some embodiments, the second shading filter 60 is disposed on the color filters 40 above the active area Z1 when the first shading filter 50 is not disposed on the color filters 40 above the active area Z1.

Figure 3:
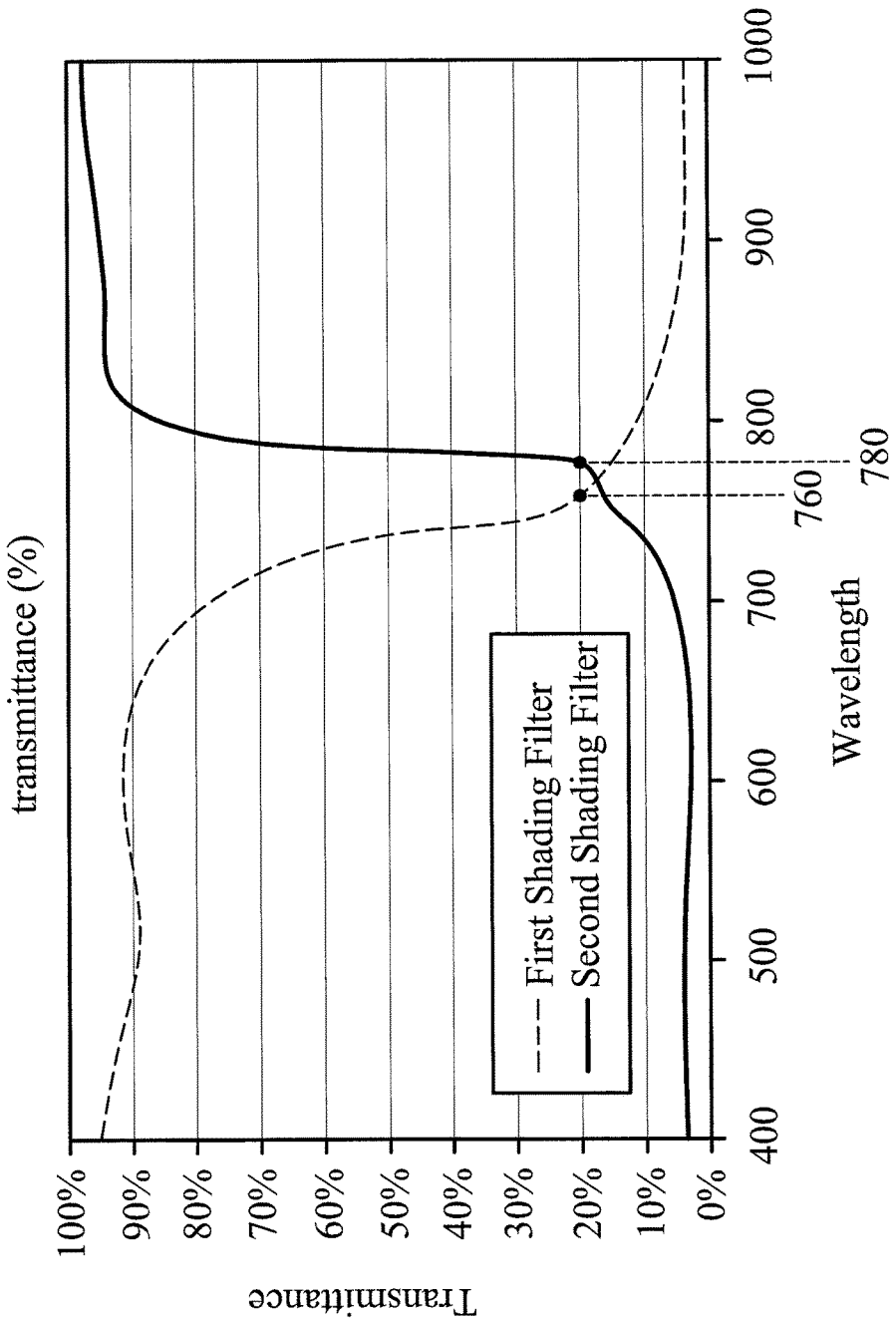
FIG. 3 shows transmittance vs. wavelength diagrams of the first shading filter and the second shading filter in accordance with some embodiments of the present disclosure.

FIG. 3 shows transmittance vs. wavelength diagrams of the first shading filter 50 and the second shading filter 60 in accordance with some embodiments of the present disclosure. In some embodiments, the second shading filter 60 is a long-pass filter. In some embodiments, the second shading filter 60 is made of a photoresist. The second shading filter 60 is configured to block some components of the light beam. In some embodiments, the components of the light beam blocked by the second shading filter 60 include a visible spectrum and an ultraviolet spectrum.

The second shading filter 60 is configured to block wavelengths of a light beam shorter than a specific wavelength (second wavelength). In this embodiment, the wavelengths of a light beam blocked by the second shading filter 60 is defined as the transmittance of the wavelengths of the light beam passing through the second shading filter 60 being lower than 20%.

In some embodiments, the second wavelength is in a range from about 772 nm to 800 nm. In some embodiments, the second wavelength is about 780 nm. The first wavelength is shorter than the second wavelength.

As shown in FIGS. 2 and 3, the second shading filter 60 is disposed on the first shading filter 50. The first shading filter 50 is configured to block wavelengths of a light beam longer than a first wavelength, the second shading filter 60 is configured to block wavelengths of the light beam shorter than a second wavelength, and the first wavelength is shorter than the second wavelength.

When a light beam (such as a white light beam or sunlight) passes through the second shading filter 60 and the first shading filter 50, all of the wavelengths of the light beam are substantially blocked by the second shading filter 60 and the first shading filter 50. In other words, the second shading filter 60 is configured to block components of the light beam, and the first shading filter 50 is configured to block remained components of the light beam. Therefore, all components of the light beam are substantially blocked by the second shading filter 60 and the first shading filter 50.

Accordingly, the second shading filter 60 and the first shading filter 50 above the shading area Z2 prevent a light beam from falling on the shading area Z2 of the sensing layer 10. The second shading filter 60 and the first shading filter 50 above the shading area Z2 are functioned as the black material in the conventional art.

Figure 4:
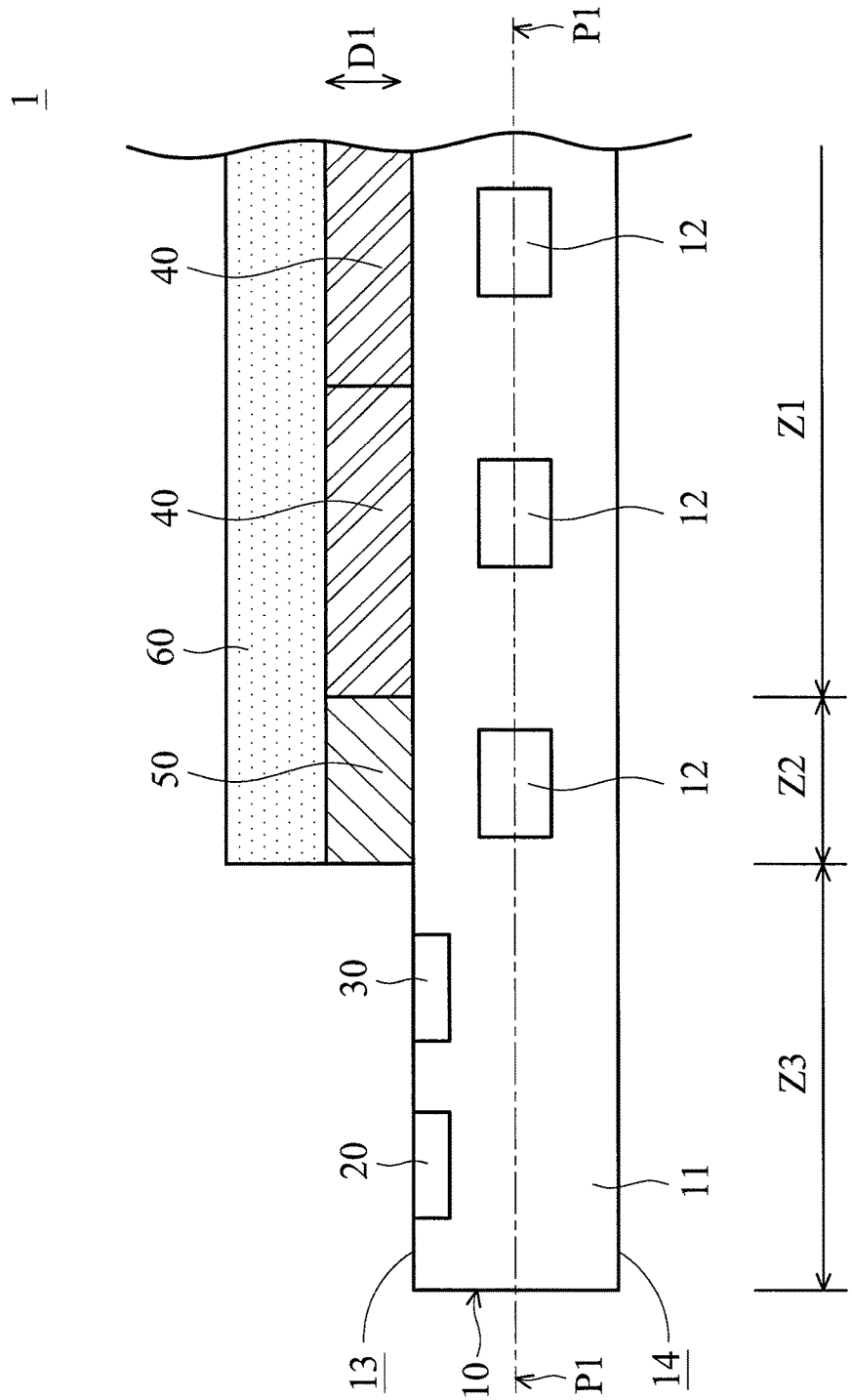
FIG. 4 is a cross-sectional view of the optical sensor in accordance with some embodiments of the present disclosure.

FIG. 4 is a cross-sectional view of the optical sensor 1 in accordance with some embodiments of the present disclosure. The first shading filter 50 is disposed on the shading area Z2. The first shading filter 50 is connected to the sensing layer 10 and the side walls of the color filters 40. The first shading filter 50 is around the color filters 40. In the other words, the first shading filter 50 is a ring-like shape.

In some embodiments, the first shading filter 50 is not disposed on the peripheral area Z3 and the active area Z1. In some embodiments, the height of the first shading filter 50 relative to the sensing layer 10 is equal to the height of the color filters 40 relative to the sensing layer 10.

In some embodiments, the first shading filter 50 is a long-pass filter. The first shading filter 50 is configured to block some components (remained components) of the light beam. In some embodiments, the components of the light beam blocked by the first shading filter 50 include a visible spectrum and an ultraviolet spectrum. The first shading filter 50 is configured to block wavelengths of a light beam shorter than a specific wavelength (second wavelength).

The second shading filter 60 is disposed on the first shading filter 50, and located over the shading area Z2. The second shading filter 60 is also disposed on the color filters 40, and located over the active area Z1. In some embodiments, the second shading filter 60 is not disposed on the color filters 40, and is not located over the active area Z1.

In some embodiments, the second shading filter 60 is a short-pass filter. The component of the light beam blocked by the second shading filter 60 includes an infrared spectrum. The second shading filter 60 is configured to block wavelengths of a light beam longer than a specific wavelength (first wavelength). Therefore, an infrared spectrum of a light beam is blocked by the second shading filter 60. The sensing units 12 under the color filter 40 may not receive the infrared spectrum, and thus the quality of the image made by the optical sensor 1 is improved.

Figure 5:
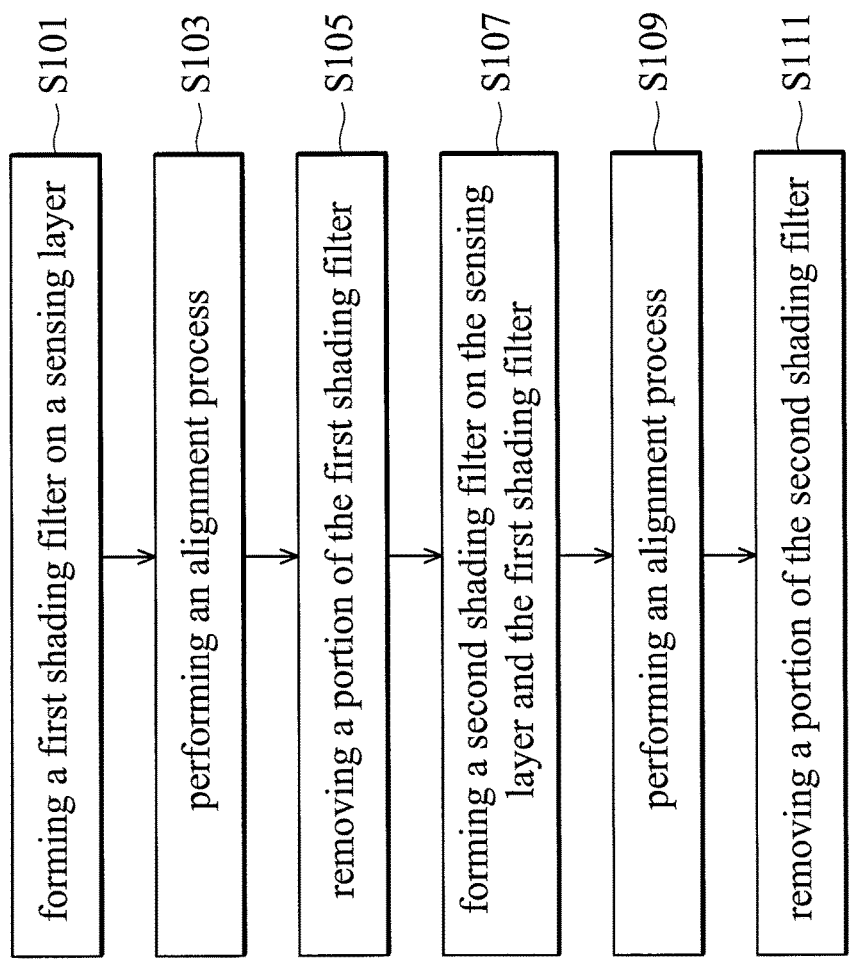
FIG. 5 is a flow chart of a manufacturing method of an optical sensor in accordance with some embodiments of the present disclosure.
Figure 6A:
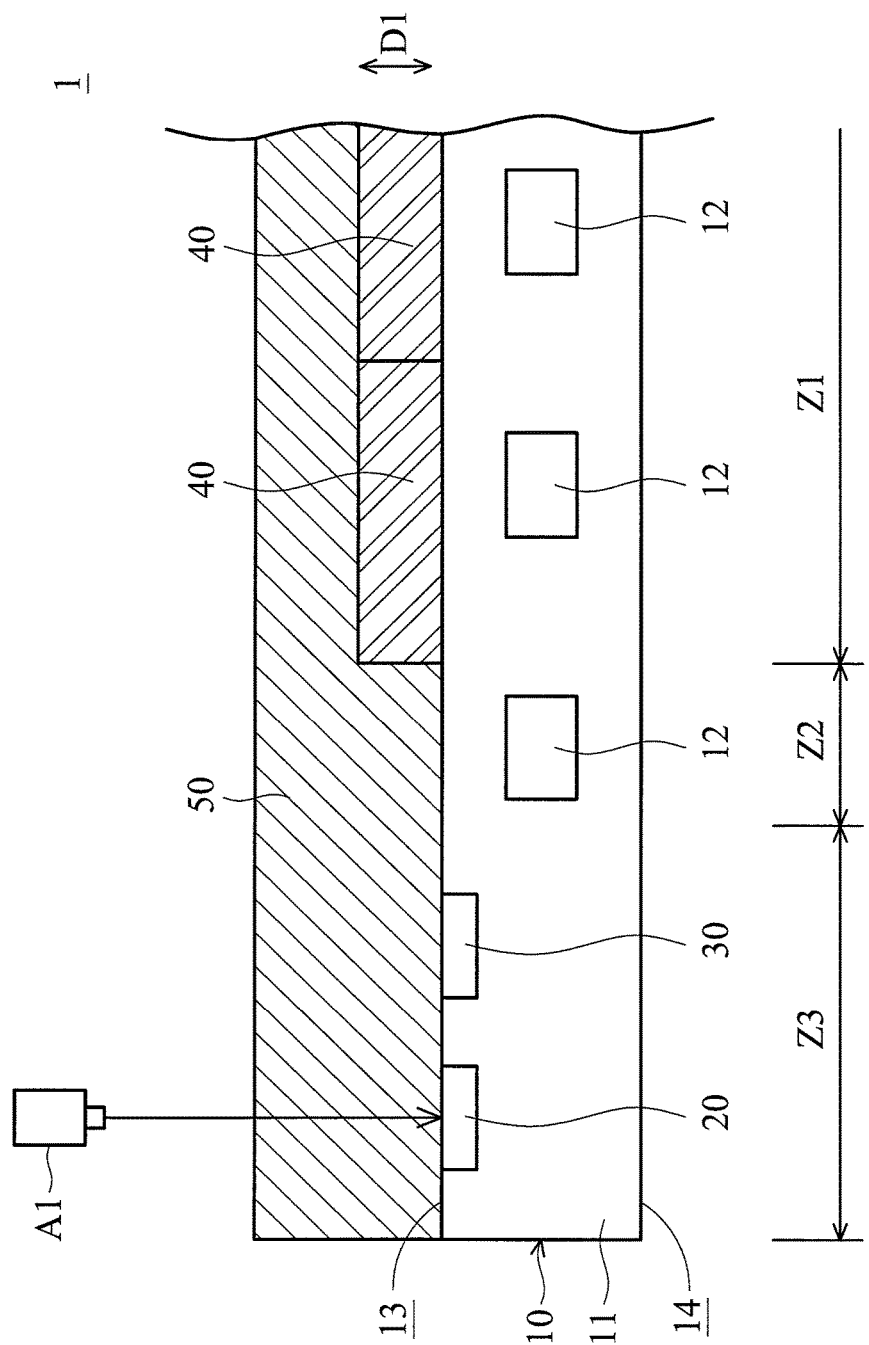
FIGS. 6A, 6B and 6C are schematic views of the manufacturing method of an optical sensor during intermediate stages.
Figure 6B:
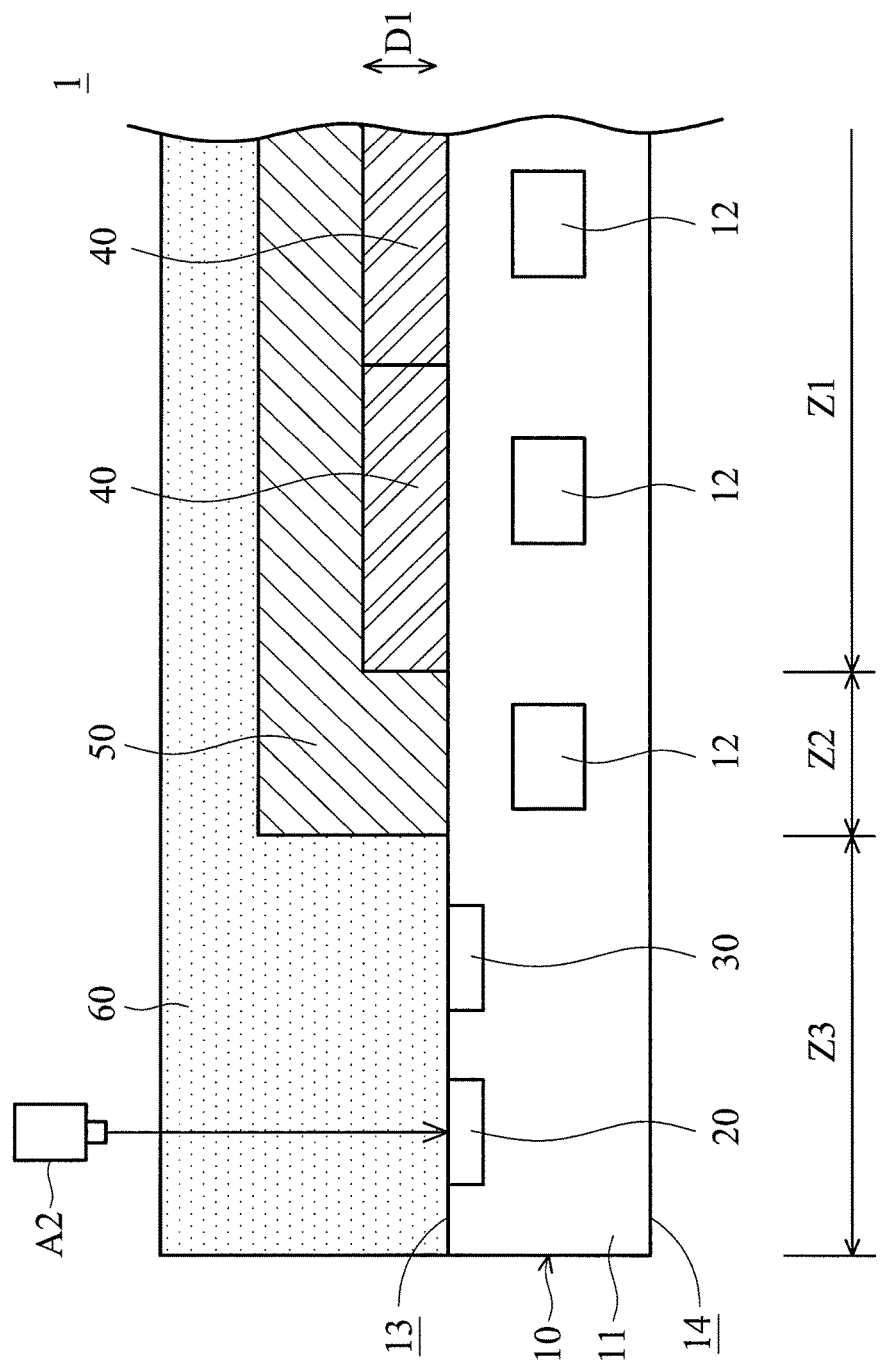
Figure 6C:
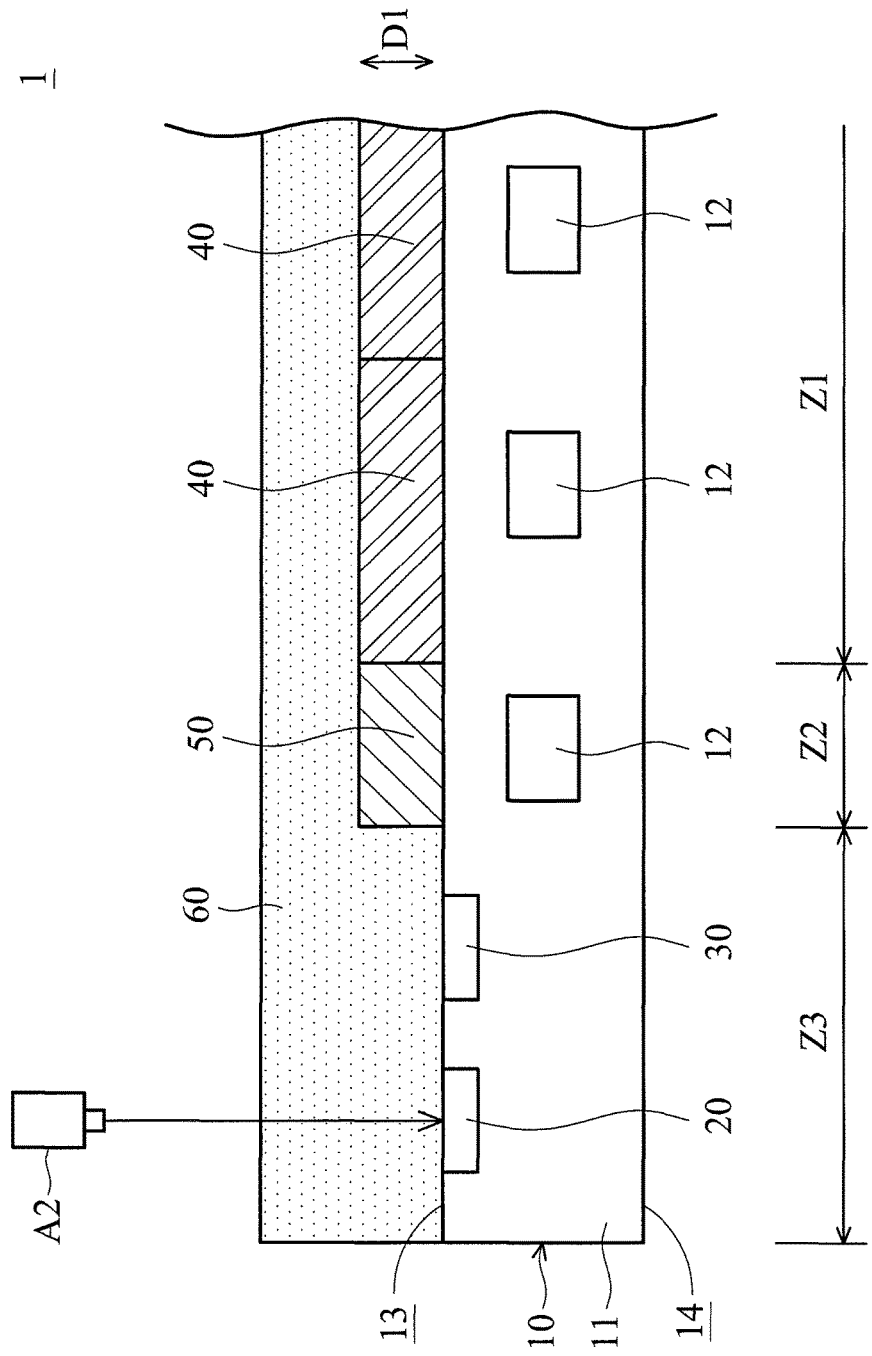

FIG. 5 is a flow chart of a manufacturing method of an optical sensor 1 in accordance with some embodiments of the present disclosure. FIGS. 6A, 6B and 6C are a schematic view of the manufacturing method of the optical sensor 1 during intermediate stages. In step S101, the color filters 40 are formed on the active area Z1 of the sensing layer 10. Afterwards, the first shading filter 50 is formed on the sensing layer 10 and the color filters 40 as shown in FIG. 6A. In other words, the first shading filter 50 is formed on the active area Z1, the shading area Z2 and the peripheral area Z3 of the sensing layer 10, and covers the alignment mark 20 and the conductive pad 30.

In this embodiment, the first shading filter 50 is made of a photoresist. In some embodiments, the first shading filter 50 is made of a multilayer coating, and the first shading filter 50 is formed by a lift-off process.

In step S103, an alignment process is performed on the alignment mark 20 by an alignment device A1 as shown in FIG. 6A. In some embodiments, the alignment device A1 utilizes a visible light beam to detect the alignment mark 20 when the first shading filter 50 is a short-pass filter. In some embodiments, the alignment device A1 utilizes a light beam with a wavelength of about 500 nm to detect the alignment mark 20.

Therefore, the light beam emitted by the alignment device A1 can pass through the first shading filter 50 and fall on the alignment mark 20 when the first shading filter 50 is a short-pass filter. The alignment process can be appropriately performed without manually removing the first shading filter 50 above the alignment mark 20, and thus the manufacturing time of the optical sensor 1 is decreased.

In some embodiments, the alignment device A1 utilizes an infrared light beam to detect the alignment mark 20 when the first shading filter 50 is a long-pass filter. In some embodiments, the alignment device A1 utilizes a light beam with a wavelength of about 935 nm to detect the alignment mark 20. Therefore, the light beam emitted by the alignment device A1 can pass through the first shading filter 50 and fall on the alignment mark 20 when the first shading filter 50 is a long-pass filter.

In step S105, a portion of the first shading filter 50 is removed by semiconductor manufacturing process, such as a lithography process and/or etching process. The first shading filter 50 over the peripheral area Z3 is removed as shown in FIGS. 2 and 4. In some embodiments, the first shading filter 50 over the active area Z1 is not removed as shown in FIG. 2. In some embodiments, the first shading filter 50 over the active area Z1 is removed as shown in FIG. 4.

In step S107, the second shading filter 60 is formed on the sensing layer 10 and the first shading filter 50 as shown in FIG. 6B. In other words, the second shading filter 60 is formed on the active area Z1, the shading area Z2 and the peripheral area Z3 of the sensing layer 10, and covers the alignment mark 20 and the conductive pad 30.

In some embodiments, the second shading filter 60 is formed on the peripheral area Z3, the first shading filter 50 and the color filters 40 as shown in FIG. 6C.

In step S109, an alignment process is performed on the alignment mark 20 by an alignment device A2 as shown in FIGS. 6B and 6C.

In some embodiments, the alignment device A2 utilizes an infrared light beam to detect the alignment mark 20 when the second shading filter 60 is a long-pass filter as shown in FIG. 6B. In some embodiments, the alignment device A2 utilizes a light beam with a wavelength of about 935 nm to detect the alignment mark 20.

Therefore, the light beam emitted by the alignment device A2 can pass through the second shading filter 60 and fall on the alignment mark 20. The alignment process can be appropriately performed without manually removing the second shading filter 60 above the alignment mark 20.

In some embodiments, the alignment device A2 utilizes a visible light beam to detect the alignment mark 20 when the second shading filter 60 is a short-pass filter as shown in FIG. 6C. In some embodiments, the alignment device A2 utilizes a light beam with a wavelength of about 500 nm to detect the alignment mark 20. Therefore, the light beam emitted by the alignment device A2 can pass through the second shading filter 60 and fall on the alignment mark 20.

In step S111, a portion of the second shading filter 60 is removed by a semiconductor manufacturing process, such as a lithography process and/or etching process. In some embodiments, the second shading filter 60 over the peripheral area Z3 and the active area Z1 is removed as shown in FIG. 2. In some embodiments, the second shading filter 60 over the active area Z1 is not removed as shown in FIG. 4. In some embodiments, the second shading filter 60 over the peripheral area Z3 is not removed.

In conclusion, the optical sensor utilizes the first shading filter and the second shading filter to replace the block material in the conventional art. Therefore, the first shading filter above the alignment mark does not need to be manually removed during the manufacturing process of the optical sensor, and thus the manufacturing time of the optical sensor is decreased.

The disclosed features may be combined, modified, or replaced in any suitable manner in one or more disclosed embodiments, but are not limited to any particular embodiments.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. An optical sensor, comprising:
a sensing layer comprising an active area, a shading area around the active area, and a peripheral area around the shading area;
a first shading filter disposed on the shading area; and
a second shading filter disposed on the first shading filter, wherein one of the first shading filter and the second shading filter extends from the shading area and is disposed over the active area, and wherein when a light beam is emitted to the shading area, the second shading filter is configured to block a first component of the light beam, and the first shading filter is configured to block a second component of the light beam.

2. The optical sensor as claimed in claim 1, wherein the first shading filter is distant from the peripheral area.

3. The optical sensor as claimed in claim 2, wherein the second shading filter is further disposed on the peripheral area.

4. The optical sensor as claimed in claim 1, further comprising a conductive pad disposed on the peripheral area, and an alignment mark disposed on the peripheral area and distant from the conductive pad.

5. The optical sensor as claimed in claim 1, wherein the first shading filter and the second shading filter are distant from the active area in a stacking direction perpendicular to the sensing layer.

6. The optical sensor as claimed in claim 1, further comprising a plurality of color filters disposed on the active area, wherein the first shading filter is around the color filters.

7. The optical sensor as claimed in claim 6, wherein the first shading filter is further disposed on the color filters, and the second shading filter is distant from the color filters.

8. The optical sensor as claimed in claim 6, wherein the second shading filter is further disposed on the color filters, and the first shading filter is distant from the color filters.

9. The optical sensor as claimed in claim 1, wherein the first component of the light beam blocked by the second shading filter comprises an infrared spectrum, and the second component of the light beam blocked by the first shading filter comprises a visible spectrum and an ultraviolet spectrum.

10. The optical sensor as claimed in claim 1, wherein the first component of the light beam blocked by the second shading filter comprises a visible spectrum and an ultraviolet spectrum, and the second component of the light beam blocked by the first shading filter comprises a visible spectrum and an infrared spectrum.

11. The optical sensor as claimed in claim 1, wherein the first shading filter is a short-pass filter, and the second shading filter is a long-pass filter.

12. The optical sensor as claimed in claim 1, wherein the first shading filter is a long-pass filter, and the second shading filter is a short-pass filter.

13. The optical sensor as claimed in claim 1, wherein the first shading filter is configured to block wavelengths of the light beam longer than a first wavelength, the second shading filter is configured to block wavelengths of the light beam shorter than a second wavelength, and the first wavelength is shorter than the second wavelength.

14. The optical sensor as claimed in claim 1, wherein the first shading filter is configured to block wavelengths of the light beam shorter than a second wavelength, the second shading filter is configured to block wavelengths of the light beam longer than a first wavelength, and the first wavelength is shorter than the second wavelength.

15. The optical sensor as claimed in claim 1, wherein the first shading filter is made of a photoresist or multilayer coating, and the second shading filter is made of a photoresist.

16. A manufacturing method of an optical sensor, comprising:

forming a first shading filter on an active area, a shading area and a peripheral area of a sensing layer, wherein the shading area is around the active area, and the peripheral area is around the shading area, and an alignment mark is located on the peripheral area;

performing an alignment process on the alignment mark by an alignment device;

removing the first shading filter over the peripheral area; and forming a second shading filter on the shading area, wherein a light beam is emitted to the shading area, the second shading filter is configured to block a first component of the light beam, and the first shading filter is configured to block a second component of the light beam.

17. The manufacturing method as claimed in claim 16, further comprising forming color filters on the sensing layer, wherein the first shading filter is around the color filters.

18. The manufacturing method as claimed in claim 16, further comprising performing a second alignment process on the alignment mark by a second alignment device.

19. The manufacturing method as claimed in claim 16, further comprising removing the second shading filter over the peripheral area.

20. The manufacturing method as claimed in claim 16, wherein the first shading filter is made of a photoresist or multilayer coating, and the second shading filter is made of a photoresist.

* * * * *